(12) United States Patent
Wang

(10) Patent No.: US 8,730,723 B2
(45) Date of Patent: May 20, 2014

(54) STRUCTURES AND METHODS OF HIGH EFFICIENT BIT CONVERSION FOR MULTI-LEVEL CELL NON-VOLATILE MEMORIES

(75) Inventor: Lee Wang, Diamond Bar, CA (US)

(73) Assignee: FlashSilicon Incorporation, Diamond Bar, CA (US)

( * ) Notice: Subject to any disclaimer, the term of this patent is extended or adjusted under 35 U.S.C. 154(b) by 236 days.

(21) Appl. No.: 13/417,655

(22) Filed: Mar. 12, 2012

(65) Prior Publication Data

US 2013/0235661 A1    Sep. 12, 2013

(51) Int. Cl.
*G11C 16/04* (2006.01)

(52) U.S. Cl.
USPC .................................................. 365/185.03

(58) Field of Classification Search
USPC .............. 365/185.01–185.33, 189.011–225.7
See application file for complete search history.

(56) References Cited

U.S. PATENT DOCUMENTS

| | | | |
|---|---|---|---|
| 6,791,880 B1 * | 9/2004 | Kurihara et al. ......... | 365/185.21 |
| 7,400,527 B2 | 7/2008 | Wang | |
| 7,453,083 B2 * | 11/2008 | King ............................. | 257/24 |
| 7,606,069 B2 * | 10/2009 | Wang ....................... | 365/185.03 |
| 2005/0269628 A1 * | 12/2005 | King ............................. | 257/326 |
| 2007/0217258 A1 * | 9/2007 | Wang ....................... | 365/185.03 |
| 2008/0239820 A1 * | 10/2008 | Wang ....................... | 365/185.17 |
| 2008/0266947 A1 * | 10/2008 | Wang ....................... | 365/185.03 |
| 2009/0039438 A1 * | 2/2009 | Liu ............................... | 257/369 |
| 2010/0025811 A1 * | 2/2010 | Bronner et al. .............. | 257/528 |
| 2011/0299317 A1 * | 12/2011 | Shaeffer et al. .............. | 365/106 |

* cited by examiner

*Primary Examiner* — Harry W Byrne
(74) *Attorney, Agent, or Firm* — Muncy, Geissler, Olds & Lowe, P.C.

(57) ABSTRACT

Structures and methods of converting Multi-Level Cell (MLC) Non-Volatile Memory (NVM) into multi-bit information are disclosed. In MLC NVM system, multi-bit information stored in NVM cell is represented by the states of NVM cell threshold voltage levels. In this disclosure, "P" states of NVM cell threshold voltage levels are divided into "N" groups of threshold voltage levels. Each group contains "M" states of multiple threshold voltage levels of NVM cells, where P=N×M. The "M" states of NVM cell threshold voltage levels in each group are sensed and resolved by applying one correspondent gate voltage to the group. By applying "N" multiple gate voltages, the whole "P" states of NVM cell threshold voltage levels can be sensed and efficiently converted into storing bits in the MLC NVM cells.

21 Claims, 9 Drawing Sheets

STRUCTURES AND METHODS OF HIGH EFFICIENT BIT CONVERSION FOR MULTI-LEVEL CELL NON-VOLATILE MEMORIES

BACKGROUND OF THE INVENTION

1. Field of the Invention

This invention relates to a scheme to resolve and convert Multi-Level Cell (MLC) Non-Volatile Memory (NVM) into multi-bits per NVM cell. In particular, the MLC threshold voltages are divided into several threshold voltage groups containing multiple threshold voltage sub-groups. The multiple threshold voltage subgroups in each group are sensed and resolved by applying one correspondent gate voltage to each one of the main groups. By applying multiple correspondent gate voltages to the entire main groups of MLC NVM cells, the multi-bit information in NVM cells can be accurately and efficiently obtained.

2. Description of the Related Art

Semiconductor Non-Volatile Memory (NVM), and particularly Electrically Erasable, Programmable Read-Only Memories (EEPROM), exhibit wide spread applicability in a range of electronic equipments from computers, to telecommunications hardware, to consumer appliances. In general, EEPROM serves a niche in the NVM space as a mechanism for storing firmware and data that can be kept even with power off and can be altered as needed. The flash EEPROM may be regarded as a specifically configured EEPROM that may be erased only on a global or sector-by-sector basis.

Data is stored in an EEPROM cell by modulating its threshold voltage, $V_{th}$, of the Metal-Oxide-Semiconductor Field Effect Transistor (MOSFET) through the injection of charge carriers into the charge-storage layer from the channel of the MOSFET. For example, with respect to an N-channel MOSFET, an accumulation of electrons in the floating gate, or in a dielectric layer above the FET channel region, causes the MOSFET to exhibit a relatively high threshold voltage $V_{th}$. In Single Level Cell (SLC) semiconductor NVM operations, the cells with higher threshold voltages are "off" and the cells with lower threshold voltages are "on", when applying a gate voltage between two groups of "high" and "low" threshold voltage levels to the gates of the NVM cells.

In MLC semiconductor NVM operation, multi-bit information stored in NVM cell is represented by the states of multiple NVM cell threshold voltage levels. The number of bits stored in an EEPROM cell is given by the number of resolvable threshold voltage levels, i.e., Number of Bits=$\log_2$ (numbers of resolvable threshold voltage levels). The threshold voltage levels of MLC cells are sensed by applying a single gate voltage or multiple gate voltages to the gates of NVM cells with voltage biases on the source and drain electrodes of NVM cells, respectively.

One conventional way of reading out bit information in MLC NVM cells is the single gate voltage scheme, where a constant gate voltage is applied to the gates of MLC NVM cells with biased source and drain. Since the response currents of NVM cells are the function of voltage difference between the applied gate voltage and threshold voltage of NVM cell, $V_g-V_{th}$, the states of MLC NVM cells can be determined by directly comparing the cell responding current with several preset reference currents. For the example of a two-bit MLC NVM cells in NOR-type flash, the threshold voltages of NVM cells are divided into four groups for representing (11), (10), (01), and (00) as shown in FIG. 1. A constant gate voltage $V_a$, between the groups of threshold voltages of (01) and (00) is applied to the gates of MLC NVM cells. The NVM cell response currents are $I_{D(11)}>I_{D(10)}>I_{D(01)}>I_{D(00)}$ for the voltage differences of $V_a-V_{th(11)}>V_a-V_{th(10)}>V_a-V_{th(01)}>V_a-V_{th(00)}$, where $I_{D(11)}$, $I_{D(10)}$, $I_{D(01)}$, $I_{D(00)}$, and $V_{th(11)}$, $V_{th(10)}$, $V_{th(01)}$, $V_{th(00)}$ are the response currents and the threshold voltages for the four groups, respectively. Note that the currents for the groups of (11), (10), and (01) are the "on" currents while the current for group of (00) is the "near-on or off" current for the threshold voltage near the applied voltage $V_a$ as shown in FIG. 1. Three reference currents are chosen in between the cell response currents of the four groups of NVM cells applied with the gate voltage $V_a$. By comparing the cell response currents with the three reference currents under the condition of applying gate voltage $V_a$ to the gates of NVM cells, the threshold voltages of MLC NVM cells can be determined to be in the specific belonging group and consequently converted to the stored bit information by their representing state of the NVM cells.

Although this scheme is the fastest way to determine the stored bits in the MLC NVM cells by applying only one single gate voltage, the numbers of resolvable threshold voltage levels are limited by the sensing current accuracy. Furthermore, the characteristics of the responding NVM device electric current to an applied gate voltage show electric current degeneracy in the two ends of operation regions where a small insignificant leakage current is generated for an applied gate voltage below the cell threshold voltage and the NVM cell "on" currents are saturated beyond a certain applied gate voltage in the strong inversion region. The current degeneracy further limits the sensible current range to resolve the threshold voltages of NVM cells below and beyond the applied gate voltage. Usually, the resolvable threshold voltage range with a single applied gate voltage is around few volts for a typical NOR-type flash.

Another conventional way of reading out bit information in MLC NVM cells is the varying step gate voltage scheme where multiple gate voltages are applied to the gates of MLC NVM cells. When an applied gate voltage is greater than the threshold voltages of the NVM cells, the NVM cells are turned "on", and while an applied gate voltage is less than the threshold voltages of the NVM cells the NVM cells are "off". The "on" and "off" states are sensed by a "on" current regardless the amounts of the "on" currents from the voltage differences of the applied gate voltage and the cell threshold voltages. Thus in this scheme, information coming out from the output of the sense amplifier for an NVM cell indicates that the threshold voltages of NVM cells are greater (or less) than the applied gate voltage. For an example of a conventional 2-bit per cell MLC NAND-type flash as shown in FIG. 2, three gate voltages in between the four groups of NVM threshold voltages representing (11), (10), (00), and (01) are applied to the gates of NVM cells. After completion of the three step gate voltage sequence, the two bit information stored in NVM cells are converted from the outputs of the sense amplifiers by a pre-designed logic circuitry.

In the previous U.S. Pat. Nos. 7,400,527 and 7,606,069, a Digital-to-Analog Converter (DAC) is applied to generate multiple correspondent gate voltages to the NVM cells. When the NVM cells are turned "on" from an "off" state in response to an applied incremental step gate voltage from the previous applied gate voltage the correspondent bits in the DAC for representing the state are written into the read data buffer. Although the multiple-gate-voltage scheme can resolve much smaller threshold voltage level compared with the single gate voltage scheme, the applications of multiple voltages to the gates of NVM cells require a longer time for an increasing number of applied gate voltages. In one 4-bit per cell MLC NVM design, the total 15-step gate voltage sequence to read out the storing bits in the MLC NVM cells requires more than several microseconds (>$10^{-6}$ s) in contrast to about a hundred nanoseconds (~$10^{-7}$ s) of a typical 2-bit per cell NOR-type MLC flash.

In order to resolve the sensing limitation posed in the single gate voltage scheme and the slow bit reading out speed in the multiple-gate-voltage scheme as mentioned above, we disclose a new bit reading out scheme in MLC NVM for achieving a higher threshold voltage resolution and a higher reading-out speed.

SUMMARY OF THE INVENTION

In a MLC NVM device system, the threshold voltages of NVM cells are programmed into "P−1" threshold voltage levels and one erased threshold voltage level as indicated in FIG. 3, where P is an integer. The number of bits per NVM cell in this device system is given by $\log_2 (P)$. The multiple threshold levels of NVM cells are further divided into "N" groups, each containing "M" threshold voltage levels, where P=N×M. The "N" multiple applied gate voltages correspondent to the "N" threshold voltage groups in the MLC NVM system are assigned to be the states of a first bit format, where the number of the bits is given by $\log_2 (N)$. The "M" threshold voltage states in each group are represented in a second bit format, where the number of bits is given by $\log_2 (M)$. Thus the total number of bits in the MLC NVM device system is given by $\log_2 (P) = \log_2 (N) + \log_2 (M)$, where $\log_2 (N) \neq 0$ and $\log_2 (M) \neq 0$.

To read out the storing bit information in the MLC NVM device system, "M+1" reference currents including the low and high reference current bounds are applied to resolve "M" threshold voltage levels of the MLC NVM within each threshold voltage group of "N" groups in respect to their correspondent gate voltages. For an applied gate voltage $V_{aj}$ for j=0, ..., (N−1), the NVM cell current denoted by $I_D$ ($V_{aj}-V_{thk}$) is a function of voltage difference between the applied voltage and the threshold voltage: $V_{aj}-V_{thk}$, for k= 1 ... P. When the applied voltage is less than the threshold voltages of NVM cells, that is, $V_{aj}<V_{thk}$, the NVM cell currents are "off". The device threshold current defining the NVM cell "on" and "off" are chosen to be the low bound reference current. This low bound reference current is used to separate the target threshold voltage groups from higher threshold voltage levels in response to the applied gate voltage $V_{aj}$. The NVM cells' "on" currents are further divided into "M" sub-groups by choosing "M−1" reference currents in between the cells' response "on" currents with the applied gate voltage $V_{aj}$. The high bound reference current is used to separate the target threshold voltage groups from lower threshold voltage levels in response to the applied gate voltage $V_{aj}$. If the NVM cells' responding currents in response to the applied gate voltage $V_{aj}$ are between the low bound reference current and the high bound reference current, a gate switch enables the bits representing the "j" group (i.e., the target group) of NVM threshold voltages to write into the first part of read buffers ($\log_2 N$ bits) and the bits representing the states of "M" threshold voltage sub-groups to write into the second part of read buffers ($\log_2 M$ bits). Meanwhile the cells' response currents to the applied gate voltage $V_{aj}$ for the "M" states of the NVM threshold voltage levels are sensed and compared with the "M−1" reference currents. Through a logic circuit, the states of the NVM threshold voltage levels in the target group are converted into bits and ready to be written into the second part of the read buffers. After completion of applying the "N" multiple gate voltages to the gates of NVM cells, the stored bits representing the "P=N×M" threshold voltage levels of the MLC NVM cells are fully converted and written in the read buffers.

BRIEF DESCRIPTION OF THE DRAWINGS

For a better understanding of the present invention and to show how it may be carried into effect, reference will now be made to the following drawings, which show the preferred embodiments of the present invention, in which.

DETAILED DESCRIPTION OF THE INVENTION

The present invention includes methods and schematics to achieve multi-bit reading in a single semiconductor NVM cell. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 1:
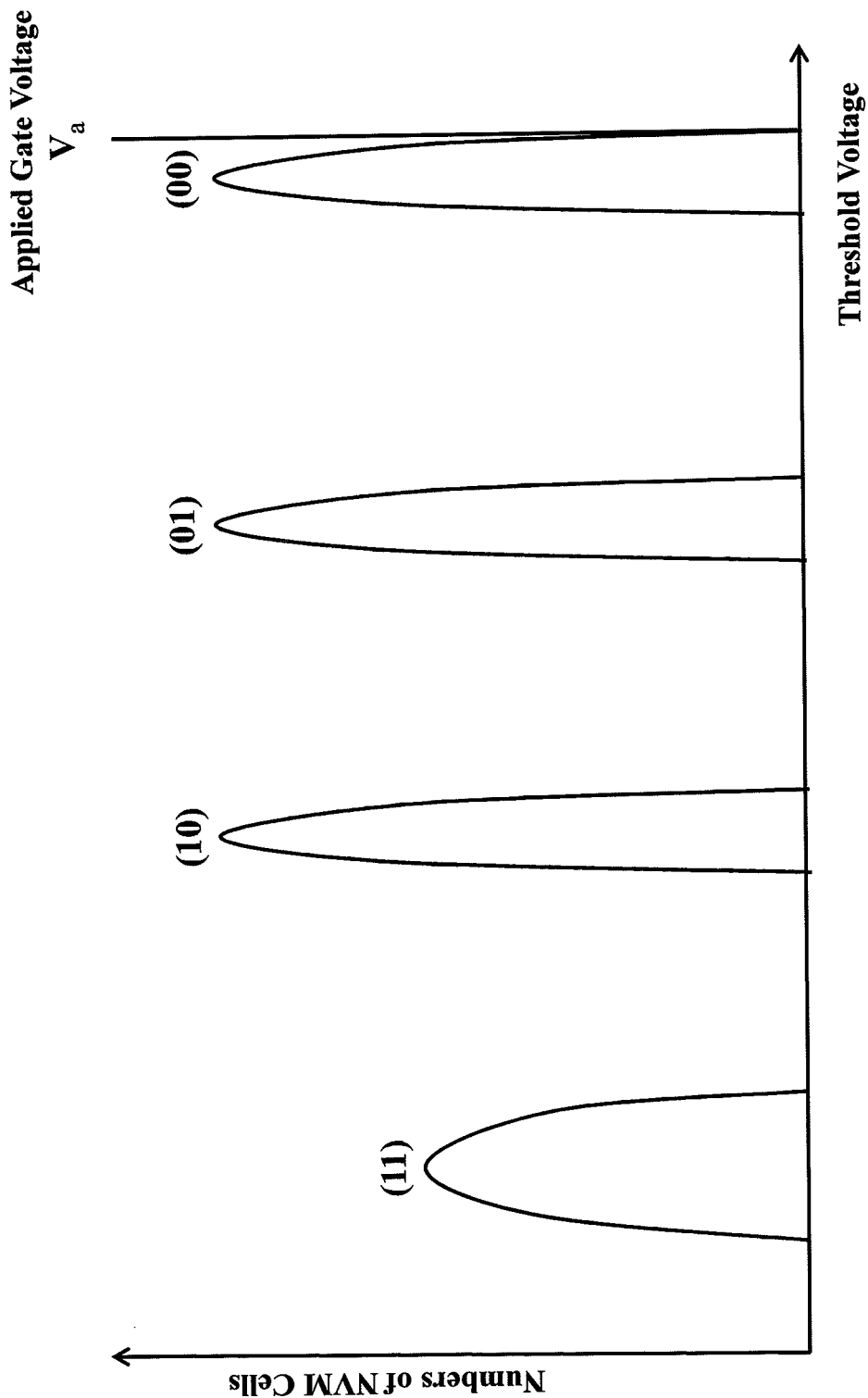
FIG. 1 illustrates the threshold voltage level distribution and the single applied gate voltage for a 2-bit per cell MLC in the conventional NOR-type flash.
Figure 2:
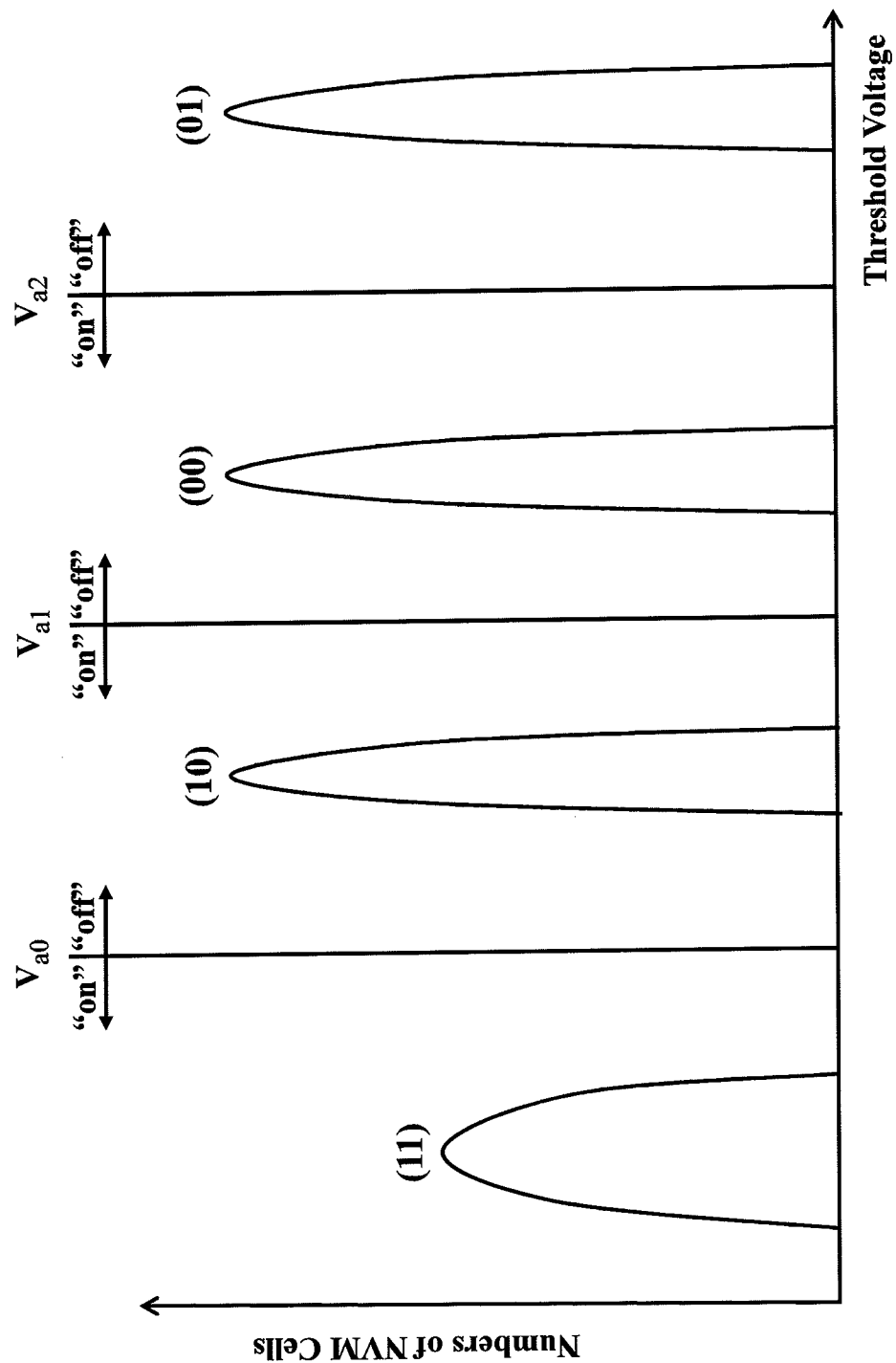
FIG. 2 illustrates the threshold voltage level distribution and the multiple applied gate voltages for a 2-bit per cell MLC in the conventional NAND-type flash.
Figure 3:
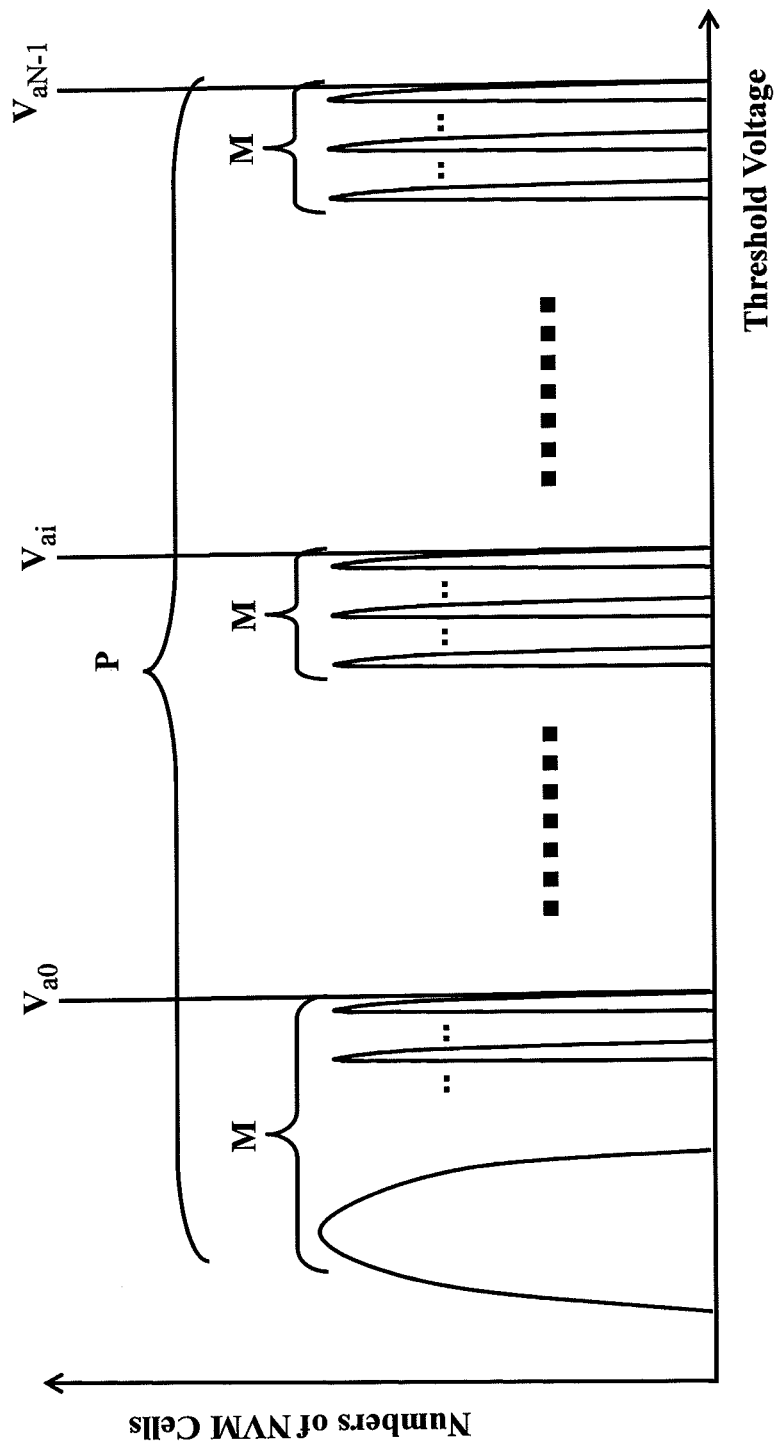
FIG. 3 shows the "P=N×M" threshold voltage level distribution and "N" multiple applied gate voltages for resolving "M" threshold voltage levels in each group in the present invention.
Figure 4:
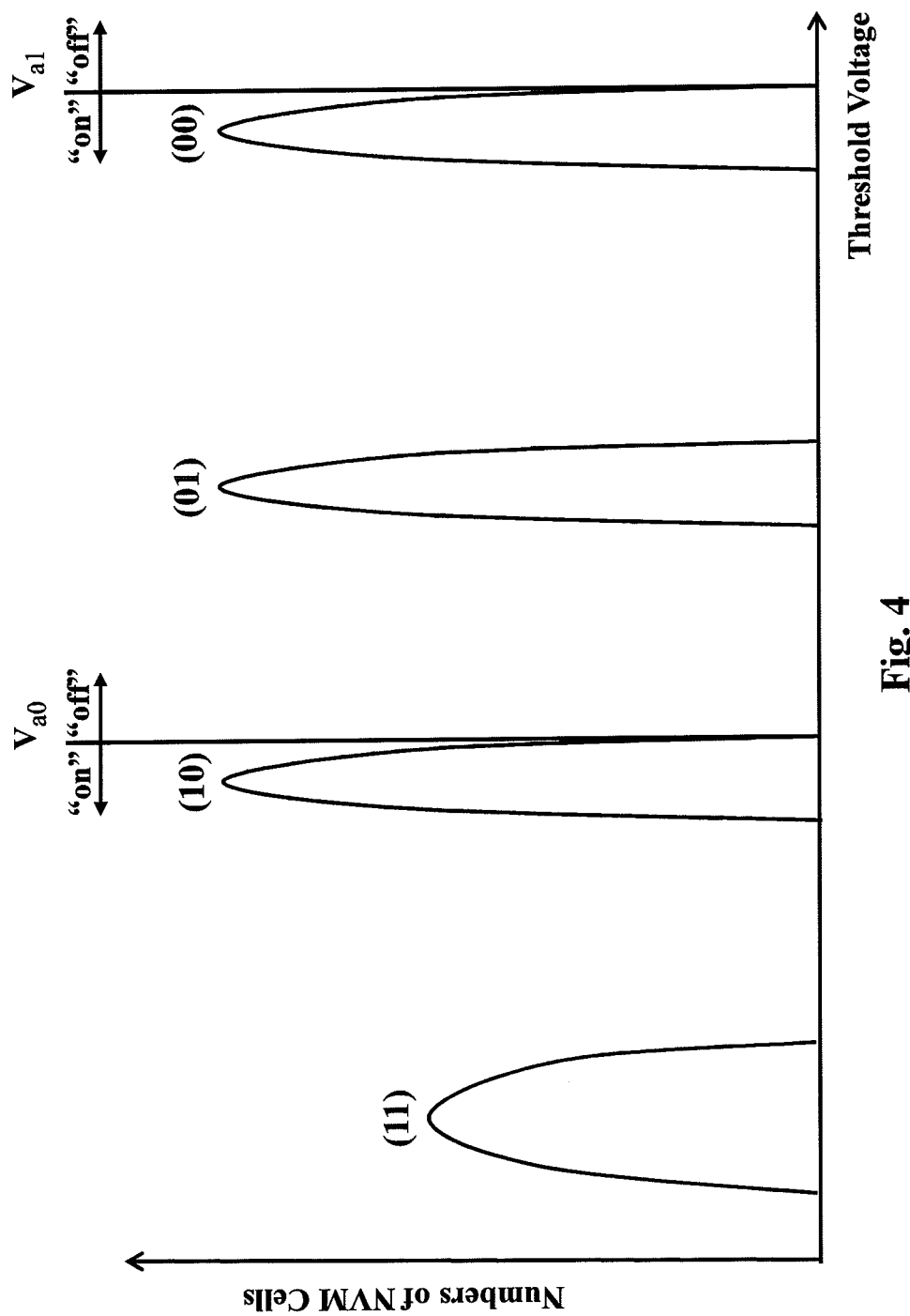
FIG. 4 shows an embodiment of threshold voltages distribution and multiple applied gate voltage for P=4, N=2, and M=2 in a 2-bit per cell MLC NVM flash in the present invention.
Figure 5:
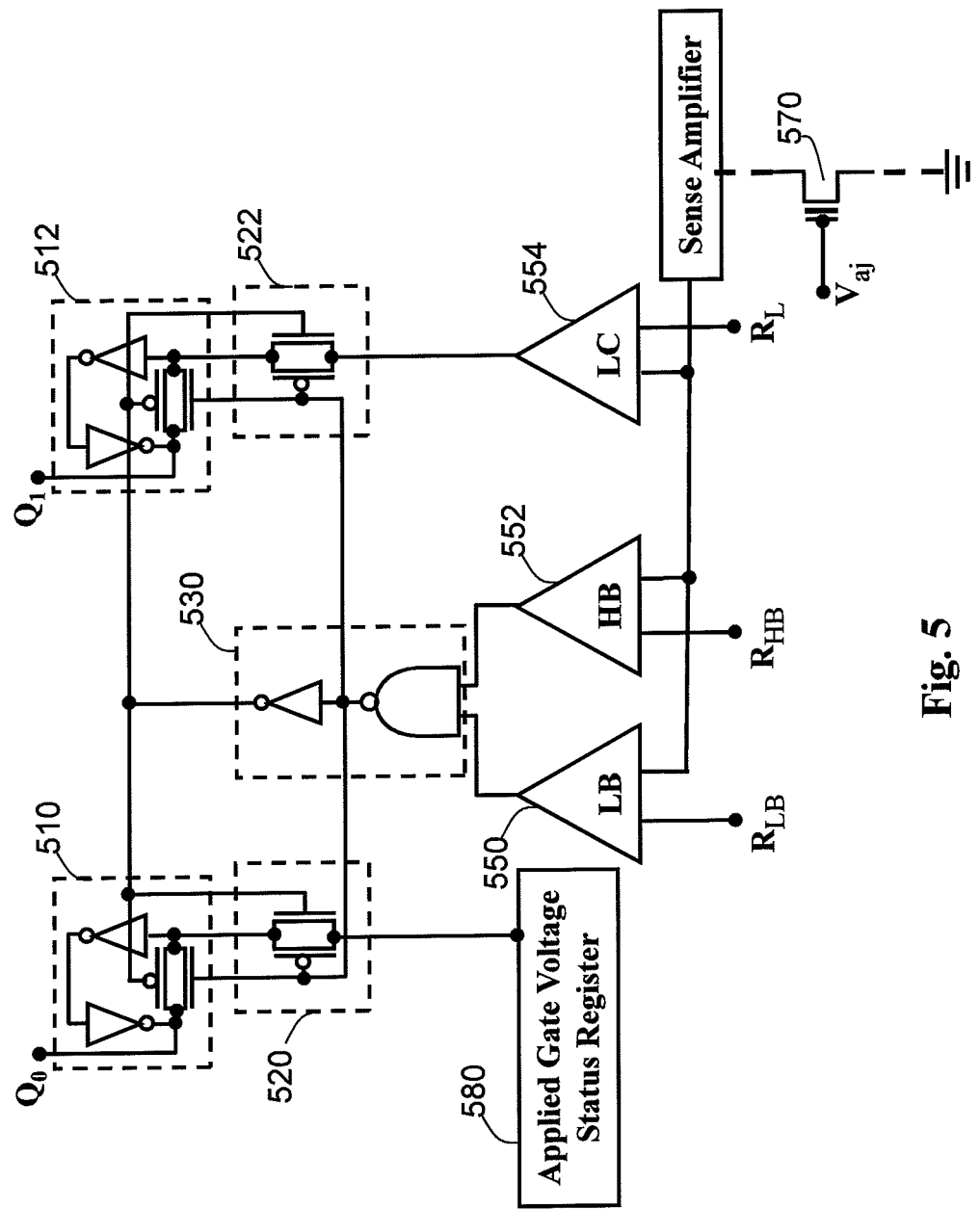
FIG. 5 shows a schematic diagram for the embodiment in FIG. 4.

FIG. 4 shows an embodiment of four groups of threshold voltage distribution assigned to (11), (10), (01) and (00), and two applied gate voltage $V_{a0}$ and $V_{a1}$ for a 2-bit per cell MLC NVM flash (P=4, N=2, and M=2). The schematic diagram is shown in FIG. 5, where two bit data buffers 510 and 512 are represented by $Q_0$ and $Q_1$, i.e., ($Q_0Q_1$) for the four threshold voltage groups. The data buffers 510 and 512 are written by bit datum from a status register 580 using a digital value to represent the two states of applied gate voltages and the result of level comparator 554 to identify the state of NVM cell 570 responding currents, respectively. Gate switches 520 and 522 for passing the one bit of applied gate-voltage status register data and one bit of level comparator result to the data buffers 510 and 512 are turned on by the logic condition that the NVM cells' response currents to the applied gate voltage $V_{aj}$ is within the range of the low bound reference $R_{LB}$ and the high bound reference $R_{HB}$.

The values of the applied gate voltage status register 580 are given by "1" for applying gate voltage $V_{a0}$ and "0" for applying gate voltage $V_{a1}$, respectively. The level comparator 554 compares the NVM cells' response currents to an applied gate voltage $V_{aj}$ with a level reference current $R_L$. The level comparator 554 is designed to output "high" (logic "1") and "low" (logic "0") for the cells' response currents greater and lower than the level reference current $R_L$, respectively. The low bound comparator 550 is designed to output "high" (logic "1") for cells' response currents greater than the low bound reference current $R_{LB}$ and the high bound comparator 552 is designed to output "high" (logic "1") for cells' response currents less than the high bound reference current $R_{HB}$. The output signals of the low bound comparator 550 and the high bound comparator 552 are fed into a logic "AND" gate 530 to control the gate switches 520 and 522. When the NVM response cell currents to an applied gate voltage $V_{aj}$ is in the range of the low bound reference current $R_{LB}$ and the high bound reference current $R_{HB}$, the AND gate 530 switches "on" the gate switches 520 and 522.

The read sequence first applies gate voltage $V_{a0}$ to the gates of NVM cells 570 and the value of the status register 580 is "1". Since the response currents for the group of NVM threshold voltages (11) to the applied voltage $V_{a0}$ are between the low and high bound reference currents and larger than the level reference current $R_L$, $Q_0$ obtains the digital value "1" from the status register 580 and $Q_1$ obtains the digital value "1" from the output "1" of the level comparator 554. Since the response currents for the group of NVM threshold voltages (10) to the applied voltage $V_{a0}$ are between the low and high bound reference currents and less than the level reference current $R_L$, $Q_0$ obtains the digital value "1" from the status register 580 and $Q_1$ obtains the digital value "0" from the output of the level comparator 554. Since the response currents to the applied voltage $V_{a0}$ for the groups of NVM threshold voltages (01) and (00) are less than the low bound reference current $R_{LB}$, the gate switches 520 and 522 are "off", and the outputs of the level comparator 554 and the status register 580 are not written into $Q_0$ and $Q_1$.

Upon applying the second gate voltage $V_{a1}$ with the status register value "0", the response currents to the applied voltage $V_{a1}$ for the groups of NVM threshold voltages (11) and (01) are greater than the high bound reference current $R_{HB}$. The gate switches 520 and 522 are "off", and the status register 580 value ("0") and the output "1" of the level comparator 554 cannot be over-written into $Q_0$ and $Q_1$. $Q_0$ and $Q_1$ for groups (11) and (01) retain their previous values. For the group of NVM threshold voltages (01) the response currents to the applied voltage $V_{a1}$ are between the low and high bound reference currents and larger than the level reference current $R_L$. Since the gate switches 520 and 522 for the group (01) are switched "on", $Q_0$ writes the digital value "0" from the status register 580 and $Q_1$ writes the digital value "1" from the output "1" of the level comparator 554. For the group of NVM threshold voltages (00), the response currents to the applied voltage $V_{a1}$ are between the low and high bound reference currents and less than the level reference current $R_L$. The gate switches 520 and 522 are switched "on" for the group (00). $Q_0$ writes the digital value "0" from the status register 580 and $Q_1$ writes the digital value "0" from the output "0" of the level comparator 554. After applying two gate voltages $V_{a0}$ and $V_{a1}$ for the 2-bit per cell MLC NVM flash, the read sequence is completed. The data buffers 510 and 512 correctly present the storing bits in the probed MLC NVM cells.

Figure 6:
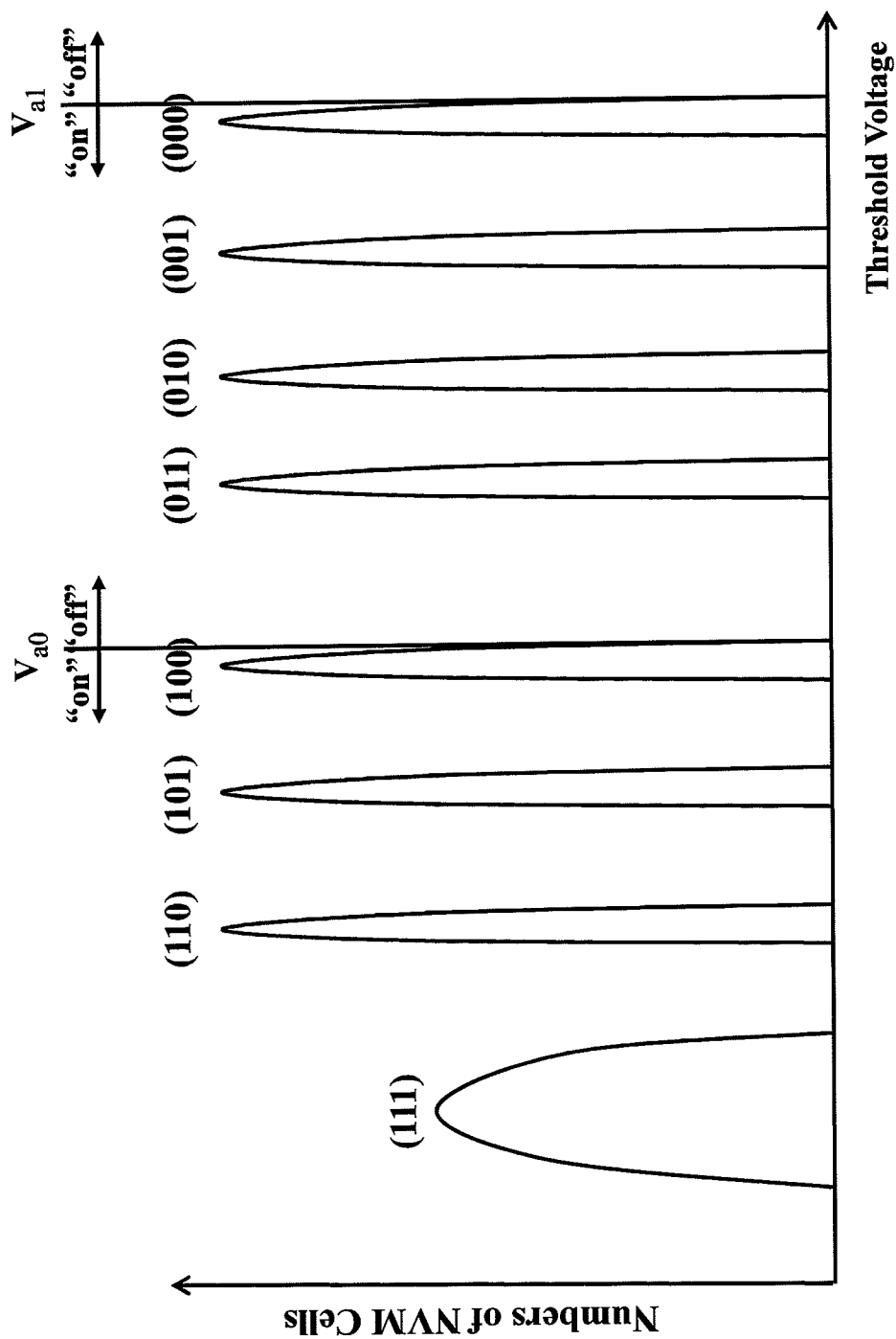
FIG. 6 shows an embodiment of threshold voltages distribution and multiple applied gate voltage for P=8, N=2, and M=4 in a 3-bit per cell MLC NVM flash in the present invention.
Figure 7:
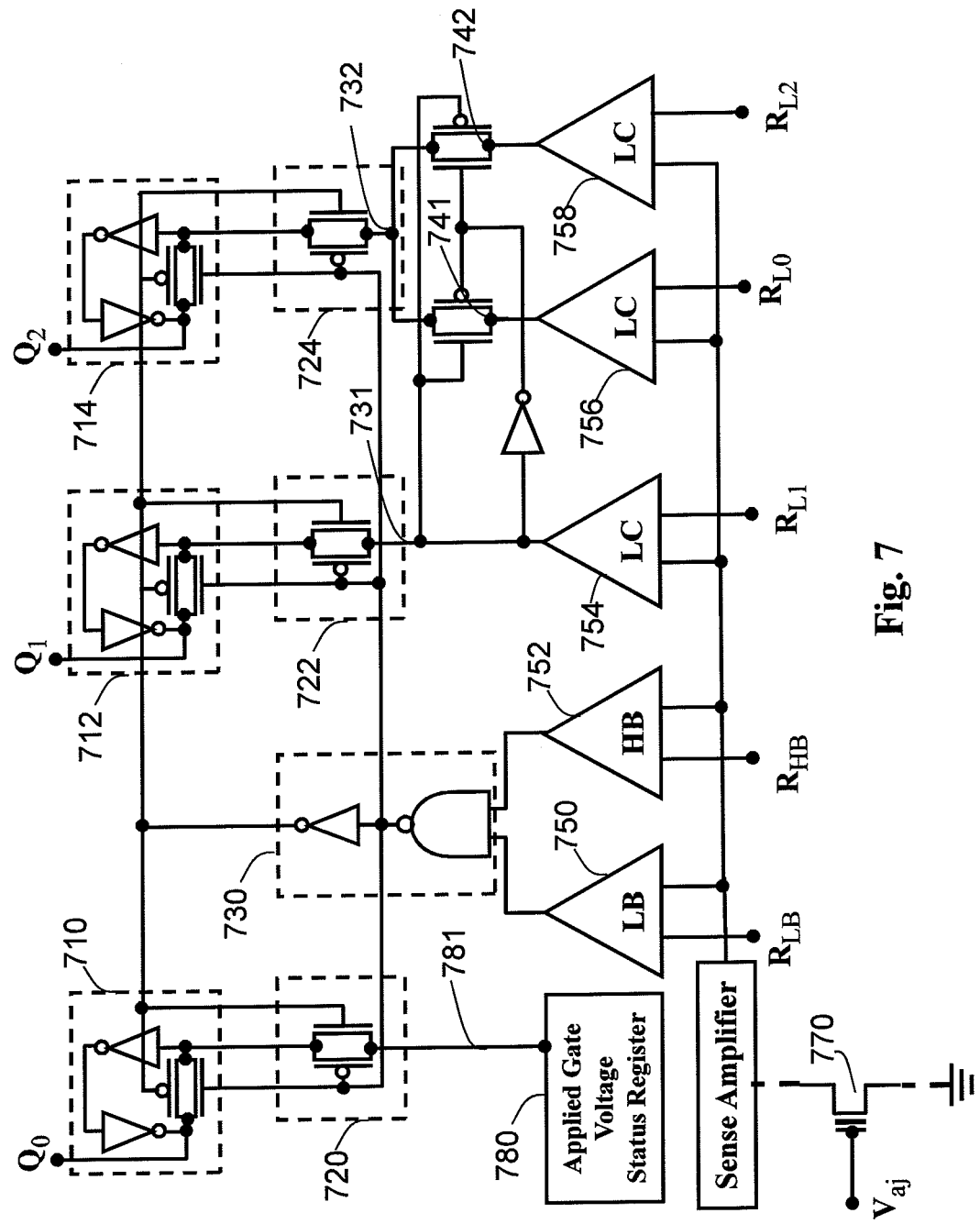
FIG. 7 shows a schematic diagram for the embodiment in FIG. 6.

FIG. 6 shows an embodiment of eight groups of threshold voltage distribution assigned to (111), (110), (101), (100), (011), (010), (001), and (000) and two applied gate voltage $V_{a0}$ and $V_{a1}$ for a 3-bit per cell MLC NVM flash (P=8, N=2, and M=4). The schematic diagram is shown in FIG. 7, where three bit data buffers 710, 712, and 714 are represented by $Q_0$, $Q_1$, $Q_2$, i.e., ($Q_0Q_1Q_2$) for the eight threshold voltage groups. The data buffers 710, 712 and 714 are written by bit datum from the output node 781 of a one-bit status register 780 representing the two states of two applied gate voltages $V_{aj}$, and from the two-bit output nodes 731 and 732 of three level comparators 754, 756, and 758. Gate switches 720, 722, and 724 for passing the status register data and the two-bit outputs at the two-bit output nodes 731 and 732 of level comparators 754, 756, and 758, to the data buffers 710, 712, and 714 are turned on by the logic condition that the NVM cells' response currents to an applied gate voltage are in the range of the low bound reference current $R_{LB}$ and the high bound reference current $R_{HB}$.

The value of the applied gate voltage status register 780 is given by "1" for applying gate voltage $V_{a0}$ and "0" for applying gate voltage $V_{a1}$, respectively. Three level comparators 754, 756, and 758 compares the NVM cells' response currents to an applied gate voltage $V_{aj}$ with three level reference currents, $R_{L0}$, $R_{L1}$, and $R_{L2}$, where $R_{L0}>R_{L1}>R_{L2}$. The level comparators 754, 756, and 758 are designed to output "high" (logic "1") when the cells' response currents are greater than the level reference currents and vice versa. According to the output signals of the level comparator 754, one of the output signals at the output nodes 741 and 742 of two level comparators 756 and 758 is passed to the input node 732 of gate switch 724. If the threshold voltages of the NVM cells belong to the smaller threshold voltages groups (response currents larger than $R_{L1}$), the output signal of level comparator 756 is passed to the input node 732 of switch 724. The output signal of level comparator 758 is passed to the input node 732 of the switch 724 for the larger threshold voltage groups of the NVM cells (response currents less than $R_{L1}$). The low bound comparator 750 is designed to output "high" (logic "1") for cells' response currents greater than the low bound reference current $R_{LB}$ and the high bound comparator 752 is designed to output "high" (logic "1") for cells' response current less than the high bound reference current $R_{HB}$. The output signals of the low bound comparator 750 and the high bound comparator 752 are fed into a logic "AND" gate 730 to control the gate switches 720, 722 and 724. When the responding NVM cell currents to an applied gate voltage are in the range of the low bound reference current $R_{LB}$ and the high bound reference current $R_{HB}$, the AND gate 730 switches "on" the gate switches 720, 722, and 724.

The read sequence first applies gate voltage $V_{a0}$ to the gates of NVM cells 770 and the value of the status register 780 is "1". Since the responding currents for the target groups (111), (110), (101), and (100) of NVM threshold voltages to the applied voltage $V_{a0}$ are between the low and high bound reference currents, the switches 720, 722, and 724 for passing the bit datum to $Q_0$, $Q_1$ and $Q_2$ are turned "on" only for the target groups (111), (110), (101), and (100). $Q_0$ obtains the digital value "1" from the one bit applied gate-voltage status register 780. The data buffer $Q_1$ obtains either "1" or "0" from the output signals of level comparators 756 with reference current $R_{L0}$ for threshold voltage groups (11x) and (10x), respectively, where x indicates either "1" or "0". Meanwhile at this applied voltage $V_{a0}$, the output signals of the level comparators 756 with reference current $R_{L0}$ are "1" for group (111) and "0" for all other groups. The output signals of the level comparators 758 with reference $R_{L2}$ are "1" for groups (111), (110), and (101), and "0" for all the other groups. The data buffer $Q_2$ obtains the digital value either from the output node 741 of the level comparators 756, when the level comparator 754 generates an output value "1", or from the output node 742 of the level comparator 758, when the level comparator 754 generates an output value "0", respectively. In the end, the data buffers $Q_1$ and $Q_2$ are written with "1" and "1" for group (111), "1" and "0" for group (110), "0" and "1" for group (101), and "0" and "0" for group (100).

For NVM threshold voltage groups (0xx) with the applied gate voltage $V_{a0}$, the outputs of three level comparators 754, 756, 758 are "0s". Since the responding currents for NVM threshold voltage groups (0xx) with the applied gate voltage $V_{a0}$ are smaller than the lower bound reference currents $R_{LB}$, the switches 720, 722, and 724 are "off" to prevent passing the applied gate-voltage status bit and the output signals of level comparators 754, 756, and 758 to the data buffers $Q_0$, $Q_1$ and $Q_2$.

Upon applying the second gate voltage $V_{a1}$ with the status register 780 having a value "0", the response currents to the applied voltage $V_{a1}$ for the groups (111), (110), (101), and (100) of NVM threshold voltages are greater than the high bound reference current $R_{HB}$. The gate switches 720, 722, and 724 are "off" and no datum can be over-written into $Q_0$, $Q_1$, and $Q_2$. The buffers $Q_0$, $Q_1$, and $Q_2$ for the groups (111), (110), (101), and (100) of NVM threshold voltages retain their previous values at this applied gate voltage stage. Since for the target groups (011), (010), (001), and (000) of NVM threshold voltages the response currents to the applied voltage $V_{a1}$ are between the low bound reference current $R_{LB}$ and high bound reference current $R_{HB}$, the gate switches 720, 722, and 724 are "on" and ready to pass the status register bit "0" and the output signals of level comparators 754, 756, 758 into buffers $Q_0$, $Q_1$, and $Q_2$. $Q_0$ is written to "0" by the bit in the status register 780 for applying gate voltage $V_{a1}$. $Q_1$ is written by the data from the output of level comparator 754. $Q_2$ is written either from the output node 741 of level comparator 756, when the level comparator 754 generates an output value "1" or from the output node 742 of level comparator 758, when the level comparator 754 generates an output value "0", respectively. In the end, the values of $Q_0$, $Q_1$, and $Q_2$ are "0", "1", and "1" for the group of NVM cell threshold voltages (011); the values of $Q_0$, $Q_1$, and $Q_2$ are "0", "1", and "0" for the group of NVM cell threshold voltages (010); the values of $Q_0$, $Q_1$, and $Q_2$ are "0", "0", and "1" for the group of NVM cell threshold voltages (001); the values of $Q_0$, $Q_1$, and $Q_2$ are "0", "0", and "0" for the group of NVM cell threshold voltages (000).

After applying two gate voltages $V_{a0}$ and $V_{a1}$ for the 3-bit per cell MLC NVM flash the read sequence is completed. The data buffers 710, 712 and 714 correctly present the storing bits in the probed MLC NVM cells. In one embodiment of 3-bit per MLC NVM design, the time required to sense and determine the response current levels of NVM cells 770 for an applied gate voltage is about 30 nanoseconds. Thus, the total time to read out the 3-bit per MLC NVM is around 60 nanoseconds.

Figure 8:
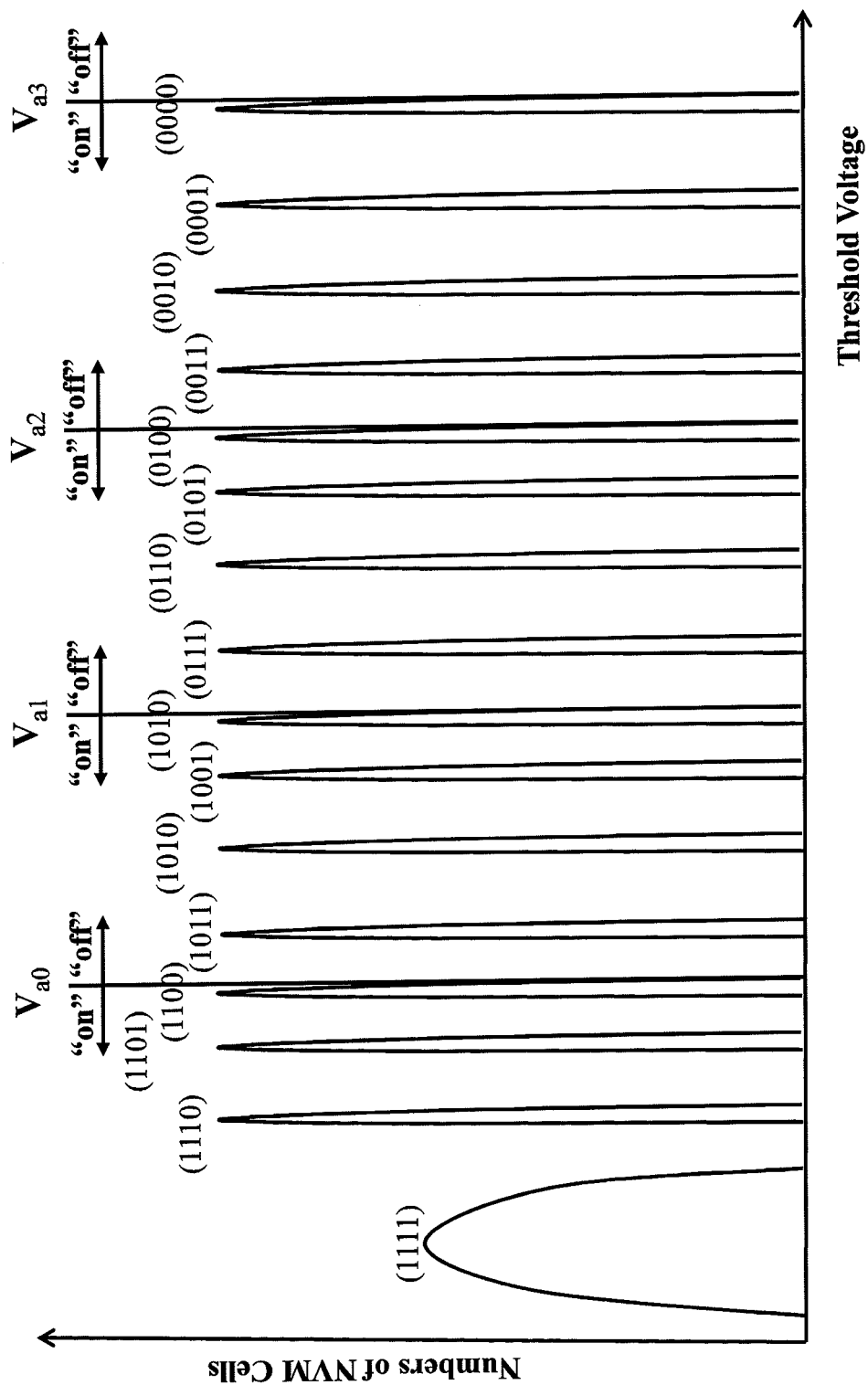
FIG. 8 shows an embodiment of threshold voltages distribution and multiple applied gate voltage for P=16, N=4, and M=4 in a 4-bit per cell MLC NVM flash in the present invention.
Figure 9:
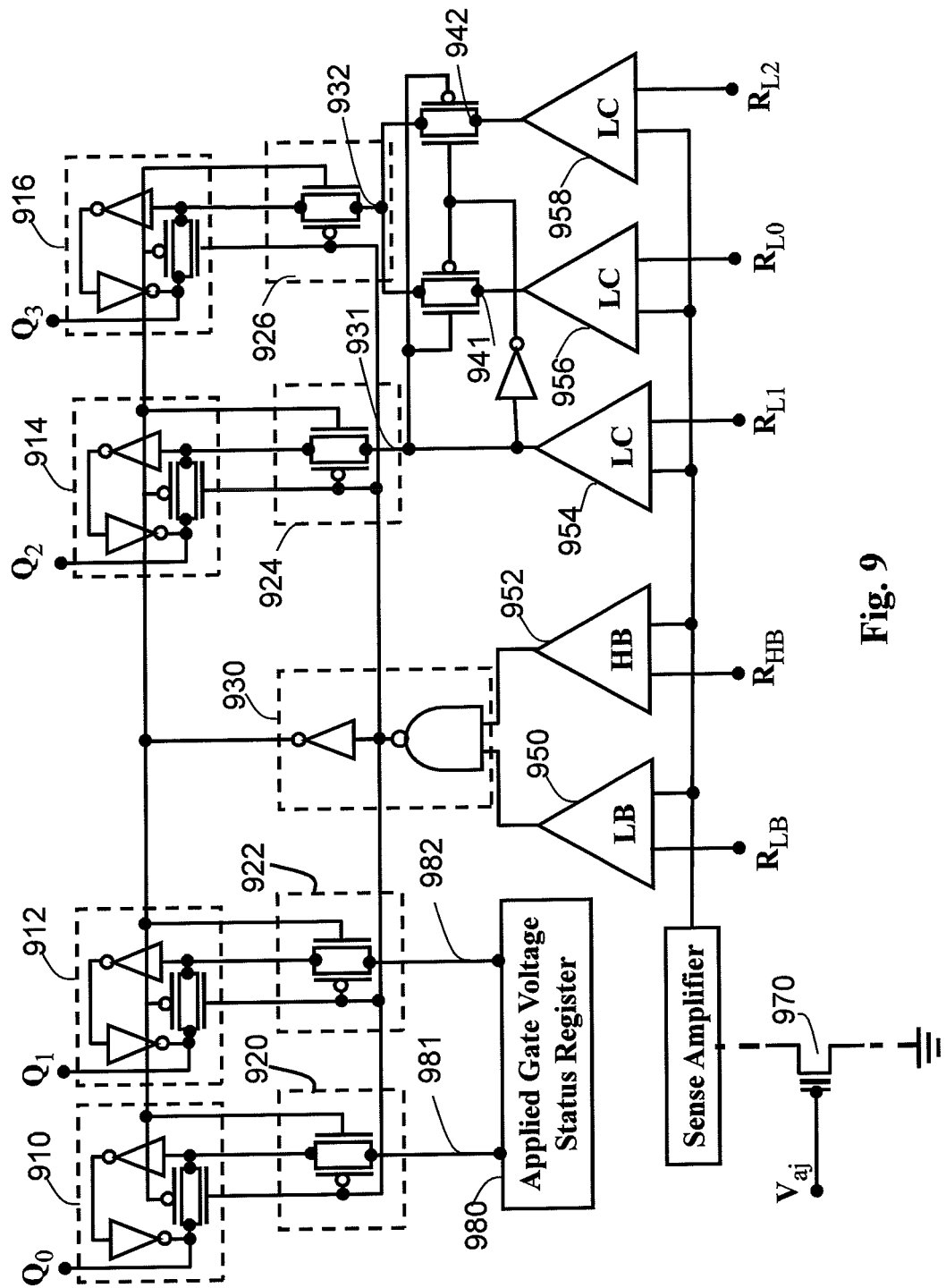
FIG. 9 shows a schematic diagram for the embodiment in FIG. 8.

FIG. 8 shows an embodiment of a 4-bit per cell MLC NVM flash (P=16, N=4, and M=4) of sixteen groups of threshold voltage distribution assigned to (1111), (1100), (1101), and (1110) for applied gate voltage $V_{a0}$; (1011), (1000), (1001), and (1010) for applied gate voltage $V_{a1}$; (0111), (0100), (0101), and (0110) for applied gate voltage $V_{a2}$; (0011), (0010), (0001), (0000) for applied gate voltage $V_{a3}$. The schematic diagram is shown in FIG. 9, where four bit data buffers 910, 912, 914, and 916 are represented by $Q_0$, $Q_1$, $Q_2$, and $Q_3$, i.e., ($Q_0Q_1Q_2Q_3$) for the sixteen threshold voltage groups. The data buffers 910, 912, 914 and 916 are written by bit datum from the two-bit output nodes 981 and 982 of a two-bit status register 980 representing the four states of the four applied gate voltages $V_{aj}$, and from the two-bit output nodes 931 and 932 of three level comparators 954, 956, and 958. Gate switches 920, 922, 924, and 926 for passing the two-bit status register datum and the two-bit data at the output nodes 931 and 932 of level comparators 954, 956, and 958, to the data buffers 910, 912, 914, and 916 are turned on by the logic condition that the cells' response currents to an applied gate voltage $V_{aj}$ are in the range of the low bound reference current $R_{LB}$ and the high bound reference current $R_{HB}$.

The value of the applied gate voltage status register 980 is given by "11" for applying gate voltage $V_{a0}$, "10" for applying gate voltage $V_{a1}$, "01" for applying gate voltage $V_{a2}$, and "00" for applying gate voltage $V_{a2}$. Three level comparators 954, 956, and 958 compares the cells' response currents to an applied gate voltage with three level reference currents, $R_{L0}$, $R_{L1}$, and $R_{L2}$, where $R_{L0} > R_{L1} > R_{L2}$. The level comparators 954, 956, and 958 are designed to output "high" (logic "1") when the cells' response currents are greater than the level reference currents and vice versa. According to the output signals of the level comparator 954, the output signal at either the node 941 or the node 942 is passed to the input node 932 of gate switch 926. If the threshold voltages of the NVM cells 970 belong to the smaller threshold voltages groups (response currents larger than $R_{L1}$), the output signal at the node 941 of the level comparator 956 is passed to the input node 932 of switch 926. While the output signal at the node 942 of level comparator 958 is passed to the input node 932 of the switch 926 for the larger threshold voltage groups of the NVM cells (response currents less than $R_{L1}$). The low bound comparator 950 is designed to output "high" (logic "1") for cells' response current greater than the low bound reference current $R_{LB}$ and the high bound comparator 952 is designed to output "high" (logic "1") for cells' response current less than the high bound reference current $R_{HB}$. The output signals of the low bound comparator 950 and the high bound comparator 952 are fed into a logic "AND" gate 930 to control the gate switches 920, 922, 924 and 926. When the response NVM cell currents to an applied gate voltage is in the range of the low bound reference current $R_{LB}$ and the high bound reference current $R_{HB}$, the AND gate 930 switches "on" the gate switches 920, 922, 924, and 926.

The read sequence first applies gate voltage $V_{a0}$ to the gates of NVM cells 970 and the value of the status register 980 is "11". Since the response currents for the target groups (1111), (1110), (1101), and (1100) of NVM threshold voltages to the applied voltage $V_{a0}$ are between the low and high bound reference currents, the switches 920, 922, 924, and 926 for passing the bit datum to $Q_0$, $Q_1$, $Q_2$ and $Q_3$ are turned "on" only for the groups (1111), (1110), (1101), and (1100). $Q_0$ and $Q_1$ write the digital value "11" from the two-bit applied gate-voltage status register 980. The data buffer $Q_2$ obtains either "1" or "0" from the output signals of level comparators 954 with reference current $R_{L1}$ for threshold voltage groups (111x) and (110x), respectively, where x indicates either "1" or "0". Meanwhile at this applied voltage $V_{a0}$ the output signals of the level comparators 956 are "1" for group (1111) and "0" for all other groups. The output signals of the level comparators 958 are "1" for groups (1111), (1110), and (1101), and "0" for all other groups. The data buffer $Q_3$ obtains the digital value either from the output signals of level comparators 956, when level comparator 954 generates an output value "1", or from the output signal of level comparator 958, when level comparator 954 generates an output value "0", respectively. Finally the data buffers $Q_2$ and $Q_3$ are written with "1" and "1" for group (1111), "1" and "0" for group (1110), "0" and "1" for group (1101), and "0" and "0" for group (1100), respectively. The output signals of level comparators 954, 956, and 958 for all other higher groups of (10xx), (01xx), and (00xx) are zero but not passed into the data buffers $Q_2$ and $Q_3$.

Upon applying the second gate voltage $V_{a1}$ with the status register value "10", the response currents to the applied voltage $V_{a1}$ for the groups (1111), (1110), (1101), and (1100) of NVM threshold voltages are greater than the high bound reference currents $R_{HB}$. The gate switches 920, 922, 924, and 926 are "off" and no datum can be over-written into the data buffers $Q_0$, $Q_1$, $Q_2$, and $Q_3$. The data buffers $Q_0$, $Q_1$, $Q_2$, and $Q_3$ for groups (1111), (1110), (1101), and (1100) of NVM threshold voltages retain their previous digital values at this applied gate voltage stage. Since for the target groups (1011), (1010), (1001), and (1000) of NVM threshold voltages the response currents to the applied voltage $V_{a1}$ are between the low bound reference current $R_{LB}$ and high bound reference current $R_{HB}$, the gate switches 920, 922, 924 and 926 are "on" and ready to pass the status register bits "10" and the output signals of level comparators 954, 956 and 958 into buffers $Q_0$, $Q_1$, $Q_2$, and $Q_3$. $Q_0$ and $Q_1$ are written to "10" by the bits of the two-bit status register 980 for applying gate voltage $V_{a1}$. $Q_2$ is written by the data from the output signal of level comparator 954. $Q_3$ is written by the data either from the output signal of level comparator 956, when the level comparator 954 generates an output value "1", or from the output signal of level comparator 958, when the level comparator 954 generates an output value "0", respectively. In the end, the values of $Q_0$, $Q_1$, $Q_2$, and $Q_3$ are "1", "0", "1" and "1" for the group of NVM cell threshold voltages (1011); the values of $Q_0$, $Q_1$, $Q_2$, and $Q_3$ are "1", "0", "1", and "0" for the group of NVM cell threshold voltages (1010); the values of $Q_0$, $Q_1$, $Q_2$, and $Q_3$ are "1", "0", "0", and "1" for the group of NVM cell threshold voltages (1001); the values of $Q_0$, $Q_1$, $Q_2$, and $Q_3$ are "1", "0", "0", and "0" for the group of NVM cell threshold voltages (1000). Since the NVM response currents to the applied gate voltage $V_{a1}$ for other groups of (01xx) and (00xx) are smaller than the low bound reference current $R_{LB}$, the gate switches 920, 922, 924 and 926 are "off" and do not pass the datum into buffers $Q_0$, $Q_1$, $Q_2$, and $Q_3$.

Upon applying the third gate voltage $V_{a2}$ with the status register value "01", the response currents to the applied voltage $V_{a2}$ for the eight groups (11xx) and (10xx) of NVM threshold voltages are greater than the high bound reference currents $R_{HB}$. The gate switches 920, 922, 924 and 926 are "off" and no datum can be over-written into the data buffers $Q_0$, $Q_1$, $Q_2$, and $Q_3$. $Q_0$, $Q_1$, $Q_2$, and $Q_3$ for eight groups (11xx) and (10xx) of NVM threshold voltages retain their previous digital values at this applied gate voltage stage. Since for the target groups (0111), (0110), (0101), and (0100) of NVM threshold voltages, the response currents to the applied voltage $V_{a2}$ are between the low bound reference current $R_{LB}$ and the high bound reference current $R_{HB}$, the gate switches 920, 922, 924 and 926 are "on" and ready to pass the status register bits "01" and the outputs of level comparators 954, 956 and 958 into the data buffers $Q_0$, $Q_1$, $Q_2$, and $Q_3$. The data buffers $Q_0$ and $Q_1$ are written to "01" by the bit of the two-bit status register 980 for applying gate voltage $V_{a2}$. $Q_2$ is written by the data from the output signal of level comparator 954. $Q_3$ is written by the data either from the output signal of level comparator 956, when the level comparator 954 generates an output value "1", or from the output signal of level comparator 958 when the level comparator 954 generates an output value "0". In the end, the values of $Q_0$, $Q_1$, $Q_2$, and $Q_3$ are "0", "1", "1" and "1" for the group of NVM cell threshold voltages (0111); the values of $Q_0$, $Q_1$, $Q_2$, and $Q_3$ are "0", "1", "1", and "0" for the group of NVM cell threshold voltages (0110); the values of $Q_0$, $Q_1$, $Q_2$, and $Q_3$ are "0", "1", "0", and "1" for the group of NVM cell threshold voltages (0101); the values of $Q_0$, $Q_1$, $Q_2$, and $Q_3$ are "0", "1", "0", and "0" for the group of NVM cell threshold voltages (0100). Since the NVM response currents to the applied gate voltage $V_{a2}$ for other four groups (00xx) are smaller than the low bound reference current $R_{LB}$, the gate switches 920, 922, 924 and 926 are "off" and do not pass the datum into buffers $Q_0$, $Q_1$, $Q_2$, and $Q_3$.

Upon applying the forth gate voltage $V_{a3}$ with the status register value "00", the response currents to the applied voltage $V_{a3}$ for the twelve groups (11xx), (10xx), and (01xx) of NVM threshold voltages are greater than the high bound reference currents $R_{HB}$. The gate switches 920, 922, 924 and 926 are "off" and no datum can be over-written into the data buffers $Q_0$, $Q_1$, $Q_2$, and $Q_3$. The data buffers $Q_0$, $Q_1$, $Q_2$, and $Q_3$ for twelve groups (11xx), (10xx), and (01xx) of NVM threshold voltages retain the previous digital values at this applied gate voltage stage. Since for the target groups (0011), (0010), (0001), and (0000) of NVM threshold voltages the response currents to the applied voltage $V_{a3}$ are between the low bound reference current $R_{LB}$ and high bound reference current $R_{HB}$, the gate switches 920, 922, 924 and 926 are "on" and ready to pass the status register bits "00" and the output signals of level comparators 954, 956 and 958 into the data buffers $Q_0$, $Q_1$, $Q_2$, and $Q_3$. $Q_0$ and $Q_1$ are written to "00" by the bit of the two-bit status register 980 for applying gate voltage $V_{a3}$. $Q_2$ is written by the data from the output signal of level comparator 954. $Q_3$ is written by the data either from the output signals of level comparator 956, when the level comparator 954 generates an output value "1", or from the output signal of level comparator 958, when the level comparator 954 generates an output value "0". In the end, the values of $Q_0$, $Q_1$, $Q_2$, and $Q_3$ are "0", "0", "1" and "1" for the group of NVM cell threshold voltages (0011); the values of $Q_0$, $Q_1$, $Q_2$, and $Q_3$ are "0", "0", "1", and "0" for the group of NVM cell threshold voltages (0010); the values of $Q_0$, $Q_1$, $Q_2$, and $Q_3$ are "0", "0", "0", and "1" for the group of NVM cell threshold voltages (0001); the values of $Q_0$, $Q_1$, $Q_2$, and $Q_3$ are "0", "0", "0", and "0" for the group of NVM cell threshold voltages (0000).

After applying four gate voltages $V_{a0}$, $V_{a1}$, $V_{a2}$ and $V_{a3}$ for the 4-bit per cell MLC NVM flash the read sequence is completed. The data buffers 910, 912, 914 and 916 correctly present the storing bits in the probed MLC NVM cells. In one embodiment of 4-bit per MLC NVM design, the time required to sense and determine the response current levels of NVM cells 970 for an applied gate voltages is about 30 nanoseconds. The total time to read out the 4-bit per MLC NVM with 4 applied gate voltage is around 120 nanoseconds.

What is claimed is:
1. A non-volatile memory structure comprising:
a MOSFET comprising:
a storage layer for storing charge representing any one of P different values; and
a control gate;
a source of $2^n$ different voltage levels in sequence, wherein the MOSFET generates a corresponding response current in response to the $2^n$ different voltage levels in sequence from the source being applied to the control gate;
a first determining circuit for comparing the response current, a low-bound current level and a high bound current level to determine whether to pass an n-bit data corresponding to the $2^n$ different voltage levels; and
a second determining circuit for measuring the response current according to $(2^m-1)$ different reference current levels to obtain an m-bit data and for determining whether to pass the m-bit data according to the result of comparing;

wherein the n-bit data and the m-bit data form the P different values, where n≠0, m≠0, $\log_2 P=(m+n)$ and P is an integer greater than two.

2. The structure according to claim 1, further comprising:
an output buffer connected to the first determining circuit and the second determining circuit for receiving the n-bit data and the m-bit data.

3. The structure according to claim 2, wherein the first determining circuit comprises:
 a low-bound comparator for comparing the response current and the low-bound current level; and
 a high-bound comparator for comparing the response current and the high-bound current level;
wherein the first determining circuit determines whether to provide the n-bit data to the output buffer according to outputs of the low-bound comparator and the high-bound comparator.

4. The structure according to claim 3, wherein the first determining circuit further comprises:
 a first switch for controlling the output of the n-bit data to the output buffer in response to the outputs of the low-bound comparator and the high-bound comparator;
wherein the first switch provides the n-bit data to the output buffer when a magnitude of the response current is between the low-bound current level and the high-bound current level.

5. The structure according to claim 3, wherein the second determining circuit comprises:
 ($2^m-1$) level comparators, each comparing the response current with one of the ($2^m-1$) different reference current levels;
wherein the second determining circuit determines whether to provide the m-bit data to the output buffer according to outputs of the ($2^m-1$) level comparators, the low-bound comparator and the high-bound comparator.

6. The structure according to claim 5, wherein the second determining circuit further comprises:
 a logic circuit for generating the m-bit data according to the outputs of the ($2^m-1$) level comparators; and
 a second switch connected to the logic circuit for controlling the output of the m-bit data to the output buffer in response to the outputs of the low-bound comparator and the high-bound comparator;
wherein the second switch provides the m-bit data to the output buffer when a magnitude of the response current is between the low-bound current level and the high-bound current level.

7. The structure according to claim 1, wherein P equals 4, n equals 1 and m equals 1.

8. The structure according to claim 1, wherein P equals 8, n equals 1 and m equals 2.

9. The structure according to claim 1, wherein P equals 16, n equals 2 and m equals 2.

10. The structure according to claim 1, further comprising:
 a status register connected to the first determining circuit for providing the n-bit data corresponding to the $2^n$ different voltage levels.

11. The structure according to claim 1, wherein the P different values correspond to P different threshold voltage levels, and wherein the P different threshold voltage levels are divided into $2^n$ groups and each of the $2^n$ groups comprises $2^m$ threshold voltage levels.

12. The structure according to claim 11, wherein the low-bound current level is used to separate a target group from its higher threshold voltage levels and the high-bound current level is used to separate the target group from its lower threshold voltage levels.

13. The structure according to claim 12, wherein the ($2^m-1$) different reference current levels are selected from current levels in between the response currents of the $2^m$ threshold voltage levels of the MOSFET by applying a corresponding voltage level to the control gate in the target group.

14. A method of determining a multi-bit value out of P different values stored on a storage layer of a MOSFET in a non-volatile memory cell, comprising:
 applying in sequence $2^n$ different voltage levels to a control gate of the MOSFET to obtain a corresponding response current;
 providing an n-bit data corresponding to one of the $2^n$ different voltage levels;
 comparing the response current, a low-bound current level and a high bound current level;
 comparing the response current with ($2^m-1$) different reference current levels to obtain an m-bit data; and
 when a magnitude of the response current is between the low-bound current level and the high-bound current level, providing the n-bit data and the m-bit data as the multi-bit value which is stored on the storage layer;
wherein n≠0, m≠0, $\log_2 P=(m+n)$ and P is an integer greater than two.

15. The method according to claim 14, wherein the step of providing further comprises:
 providing the n-bit data and the m-bit data to an output buffer.

16. The method according to claim 14, further comprising:
 storing a selected charge corresponding to the particular multi-bit value on the storage layer of the MOSFET before the step of applying.

17. The method according to claim 14, wherein the step of comparing the response current with the ($2^m-1$) different reference current levels comprises:
 respectively comparing the response current with the ($2^m-1$) different reference current levels by ($2^m-1$) level comparators; and
 obtaining the m-bit data according to results of comparing the response current with the ($2^m-1$) different reference current levels.

18. The method according to claim 14, wherein the step of providing the n-bit data comprises:
 providing the n-bit data corresponding to one of the $2^n$ different voltage levels by a status register.

19. The method according to claim 14, wherein the P different values correspond to P different threshold voltage levels, and wherein the P different threshold voltage levels are divided into $2^n$ groups and each of the $2^n$ groups comprises $2^m$ threshold voltage levels.

20. The method according to claim 19, wherein the low-bound current level is used to separate a target group from its higher threshold voltage levels and the high-bound current level is used to separate the target group from its lower threshold voltage levels.

21. The method according to claim 20, wherein the ($2^m-1$) different reference current levels are selected from current levels in between the response currents of the $2^m$ threshold voltage levels of the MOSFET by applying a corresponding voltage level to the control gate in the target group.

* * * * *